US009028953B2

(12) United States Patent
Battaglia et al.

(10) Patent No.: US 9,028,953 B2
(45) Date of Patent: May 12, 2015

(54) CVD COATED POLYCRYSTALLINE C-BN CUTTING TOOLS

(71) Applicant: Kennametal Inc., Latrobe, PA (US)

(72) Inventors: Frank Barry Battaglia, Latrobe, PA (US); Crystal Jane Nestor, Greensburg, PA (US); Peter Rudolf Leicht, Latrobe, PA (US); Kent Lewis Reiner, Latrobe, PA (US); Charles Graham McNerny, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 142 days.

(21) Appl. No.: 13/739,876

(22) Filed: Jan. 11, 2013

(65) Prior Publication Data

US 2014/0199130 A1 Jul. 17, 2014

(51) Int. Cl.
*B23B 27/14* (2006.01)
*B23P 13/00* (2006.01)
*B23P 15/28* (2006.01)

(52) U.S. Cl.
CPC .......... *B23B 27/148* (2013.01); *Y10T 29/49995* (2015.01); *Y10T 407/27* (2015.01); *B23P 13/00* (2013.01); *B23P 15/28* (2013.01)

(58) Field of Classification Search
CPC .............................. B23B 27/148; B23P 13/00
USPC ............ 51/307, 309; 428/156, 216, 336, 698, 428/699, 701, 702, 704
See application file for complete search history.

(56) References Cited

U.S. PATENT DOCUMENTS

| | | | |
|---|---|---|---|
| 4,343,651 A | 8/1982 | Yazu et al. |
| 4,619,698 A | 10/1986 | Ueda et al. |
| 4,880,755 A | 11/1989 | Mehrotra et al. |
| 4,911,756 A | 3/1990 | Nakai et al. |
| 5,034,053 A | 7/1991 | Nakai et al. |
| 5,228,812 A | 7/1993 | Noguchi et al. |
| 5,328,875 A | 7/1994 | Ueda et al. |
| 5,330,853 A | 7/1994 | Hofmann et al. |
| 5,340,780 A | 8/1994 | Sumiya |
| 5,372,873 A | 12/1994 | Yoshimura et al. |
| 5,374,471 A | 12/1994 | Yoshimura et al. |
| 5,478,634 A | 12/1995 | Setoyama et al. |

(Continued)

FOREIGN PATENT DOCUMENTS

| | | | |
|---|---|---|---|
| EP | 0102843 A2 | 3/1984 |
| EP | 0834486 A2 | 4/1998 |

(Continued)

OTHER PUBLICATIONS

Moltrecht, Single-Point Cutting Tools and Performance, Machine Shop Practice, Second Edition, 1981, pp. 199-204, Industrial Press Inc., New York, NY.

(Continued)

*Primary Examiner* — Archene Turner
(74) *Attorney, Agent, or Firm* — Matthew W. Gordon

(57) ABSTRACT

CVD coated cutting tools are provided. A coated cutting tool described herein, in some embodiments, comprises a PcBN substrate and a polished coating adhered to the substrate including one or more layers of $Al_2O_3$ deposited by chemical vapor deposition, wherein the coating has a surface roughness ($R_a$) less than about 600 nm in an area of the cutting tool for contacting a workpiece.

33 Claims, 4 Drawing Sheets

(56) References Cited

U.S. PATENT DOCUMENTS

| | | | |
|---|---|---|---|
| 5,487,625 A | 1/1996 | Ljungberg et al. | |
| 5,503,913 A * | 4/1996 | Konig et al. | 428/702 |
| 5,525,134 A | 6/1996 | Mehrotra et al. | |
| 5,569,862 A | 10/1996 | Kuroyama et al. | |
| 5,597,272 A | 1/1997 | Moriguchi et al. | |
| 5,624,766 A | 4/1997 | Moriguchi et al. | |
| 5,635,247 A | 6/1997 | Ruppi | |
| 5,676,496 A | 10/1997 | Littecke et al. | |
| 5,700,551 A | 12/1997 | Kukino et al. | |
| 5,707,185 A | 1/1998 | Mizutani | |
| 5,712,030 A | 1/1998 | Goto et al. | |
| 5,715,030 A | 2/1998 | Quaresima | |
| 5,722,803 A | 3/1998 | Battaglia et al. | |
| 5,773,140 A | 6/1998 | Cerutti et al. | |
| 5,833,021 A | 11/1998 | Mensa-Wilmot et al. | |
| 5,853,268 A | 12/1998 | Simpson | |
| 5,853,873 A | 12/1998 | Kukino et al. | |
| 5,861,210 A | 1/1999 | Lenander et al. | |
| 5,863,640 A | 1/1999 | Ljungberg et al. | |
| 5,871,850 A | 2/1999 | Moriguchi et al. | |
| 5,879,823 A | 3/1999 | Prizzi et al. | |
| 5,882,777 A | 3/1999 | Kukino et al. | |
| 5,948,716 A | 9/1999 | Kume et al. | |
| 5,981,416 A | 11/1999 | Kume et al. | |
| 6,001,757 A | 12/1999 | Fukaya et al. | |
| 6,045,440 A | 4/2000 | Johnson et al. | |
| 6,090,476 A | 7/2000 | Thysell et al. | |
| 6,140,262 A | 10/2000 | Collier et al. | |
| 6,265,337 B1 | 7/2001 | Kukino et al. | |
| 6,377,152 B1 | 4/2002 | Shikama et al. | |
| 6,599,062 B1 | 7/2003 | Oles et al. | |
| 6,635,593 B1 | 10/2003 | Kukino et al. | |
| 6,716,544 B2 | 4/2004 | Uesaka et al. | |
| 6,737,178 B2 | 5/2004 | Ota et al. | |
| 6,884,496 B2 | 4/2005 | Westphal et al. | |
| 7,081,424 B2 | 7/2006 | Okamura et al. | |
| 7,393,263 B2 | 7/2008 | Okada et al. | |
| 7,455,918 B2 | 11/2008 | Gates, Jr. et al. | |
| 7,476,063 B2 | 1/2009 | Wickman et al. | |
| 7,531,213 B2 | 5/2009 | Bjormander | |
| 7,670,980 B2 | 3/2010 | Dahl | |
| 8,323,807 B2 * | 12/2012 | Kohara et al. | 428/701 |
| 2001/0016273 A1 * | 8/2001 | Narasimhan et al. | 428/698 |
| 2003/0104254 A1 | 6/2003 | Westphal et al. | |
| 2005/0123366 A1 | 6/2005 | Goudemond et al. | |
| 2006/0127671 A1 | 6/2006 | Park et al. | |
| 2006/0204757 A1 | 9/2006 | Ljungberg | |
| 2006/0257690 A1 | 11/2006 | Bjormander | |
| 2007/0009763 A1 | 1/2007 | Littecke et al. | |
| 2007/0298281 A1 | 12/2007 | Andersson et al. | |
| 2007/0298282 A1 | 12/2007 | Andersson et al. | |
| 2008/0107882 A1 | 5/2008 | Littecke et al. | |
| 2009/0214894 A1 | 8/2009 | Kohara et al. | |
| 2010/0255345 A1 | 10/2010 | Ban et al. | |

FOREIGN PATENT DOCUMENTS

| | | | |
|---|---|---|---|
| EP | 0879806 A1 | | 11/1998 |
| EP | 0974566 A1 | | 1/2000 |
| EP | 1498199 A1 | | 1/2005 |
| EP | 1717348 A2 | | 11/2006 |
| JP | 01-96083 | | 4/1989 |
| JP | 01-096084 | | 4/1989 |
| JP | 08-126903 | | 5/1994 |
| JP | 07-172919 | | 7/1995 |
| JP | 07-328814 | | 12/1995 |
| JP | 09-011006 | | 1/1997 |
| JP | 2000-044370 | | 2/2000 |
| JP | 2000247746 | | 9/2000 |
| JP | 2005-262356 | * | 9/2005 |
| JP | 2005-335040 | * | 12/2005 |
| JP | 2006-055950 | * | 3/2006 |
| JP | 2007-083374 | * | 4/2007 |
| WO | 9304015 | | 3/1993 |
| WO | 9404316 | | 3/1994 |
| WO | 2004105983 A1 | | 12/2004 |
| WO | 2006046125 A1 | | 5/2006 |

OTHER PUBLICATIONS

Merchant, Principles of Metal Cutting and Machinability, Section 17, Tool Engineer's Handbook, 1949, pp. 302-315.

American Standard, ANSI B212.4-2002 for Cutting Tools—Indexable Inserts—Identification System, Sponsor Cemented Carbide Producer's Association (2002).

* cited by examiner

CVD COATED POLYCRYSTALLINE C-BN CUTTING TOOLS

FIELD

The present invention relates to cutting tools having coatings applied by chemical vapor deposition (CVD) and, in particular, to CVD coated polycrystalline cubic boron nitride (PcBN) cutting tools.

BACKGROUND

Cutting tools have been used in both coated and uncoated conditions for machining metals and alloys. In order to increase cutting tool wear resistance and lifetime, one or more layers of refractory materials have been applied to cutting tool surfaces. TiC, TiCN, TiOCN, TiN and $Al_2O_3$, for example, have been applied to cemented carbide substrates by CVD.

Further, cutting tools based on polycrystalline cubic boron nitride (PcBN) substrates continue to gain importance in the metal working industry given the high hardness and thermal stability (up to about 980° C.) of cBN. Similar to cemented carbides, cutting tools based on PcBN substrates can also benefit from the application of refractory coatings for various cutting applications including, machining of case-hardened and through-hardened steels, superalloys and cast iron. However, while being generally effective for inhibiting wear and extending PcBN tool life, refractory coatings have struggled in applications involving materials having poor machinability, such as unaged cast iron.

SUMMARY

In one aspect, PcBN cutting tools are described having coatings adhered thereto which, in some embodiments, demonstrate desirable wear resistance and increased cutting lifetimes. In some embodiments, for example, coated PcBN cutting tools described herein demonstrate enhanced lifetime over prior cutting tools in applications employing materials with poor machinability, such as unaged cast iron.

A coated cutting tool described herein, in some embodiments, comprises a PcBN substrate and a polished coating adhered to the substrate including one or more layers of $Al_2O_3$ deposited by chemical vapor deposition, wherein the coating has a surface roughness ($R_a$) less than about 600 nm in an area of the cutting tool for contacting a workpiece. The substrate, in some embodiments, comprises greater than 85 weight percent PcBN. Further, the coating surface roughness ($R_a$) in a workpiece contact area is can be less than 250 nm or less than 200 nm.

In another aspect, a coated cutting tool described herein comprises a PcBN substrate and a polished coating adhered to the substrate comprising a first $Al_2O_3$ layer deposited directly on the PcBN substrate and a second $Al_2O_3$ layer deposited on a layer of the coating comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table, wherein the coating has a surface roughness ($R_a$) less than about 600 nm in an area of the cutting tool for contacting a workpiece.

In another aspect, methods of making coated cutting tools are described herein. A method of making a coated cutting tool, in some embodiments, comprises providing a PcBN substrate and depositing over the substrate by chemical vapor deposition a coating comprising one or more layers of $Al_2O_3$. The deposited coating is polished to a surface roughness ($R_a$) less than 600 nm in an area of the cutting tool for contacting a workpiece. The deposited coating, in some embodiments, is polished to a surface roughness ($R_a$) less than 250 nm or less than 200 nm in a workpiece contact area. Additionally, in some embodiments, polishing the deposited coating does not alter or substantially alter the stress condition of the coating. Further, the substrate can comprise greater than 85 weight percent PcBN.

In a further aspect, methods of machining unaged cast iron workpieces are described herein. A method of machining an unaged cast iron workpiece comprises providing a coated cutting tool comprising a substrate of PcBN and a polished coating adhered thereto including one or more layers of $Al_2O_3$ deposited by chemical vapor deposition, wherein the polished coating has a surface roughness ($R_a$) less than about 600 nm in an area for contacting the workpiece. The unaged cast iron workpiece is machined with the coated PcBN cutting tool, wherein the coated cutting tool demonstrates an increase in cutting lifetime of at least 30% in comparison to a substantially identical CVD coated PcBN cutting tool wherein the coating is not polished in the workpiece contact area.

These and other embodiments are described further in the detailed description which follows.

DETAILED DESCRIPTION

Figure 1:
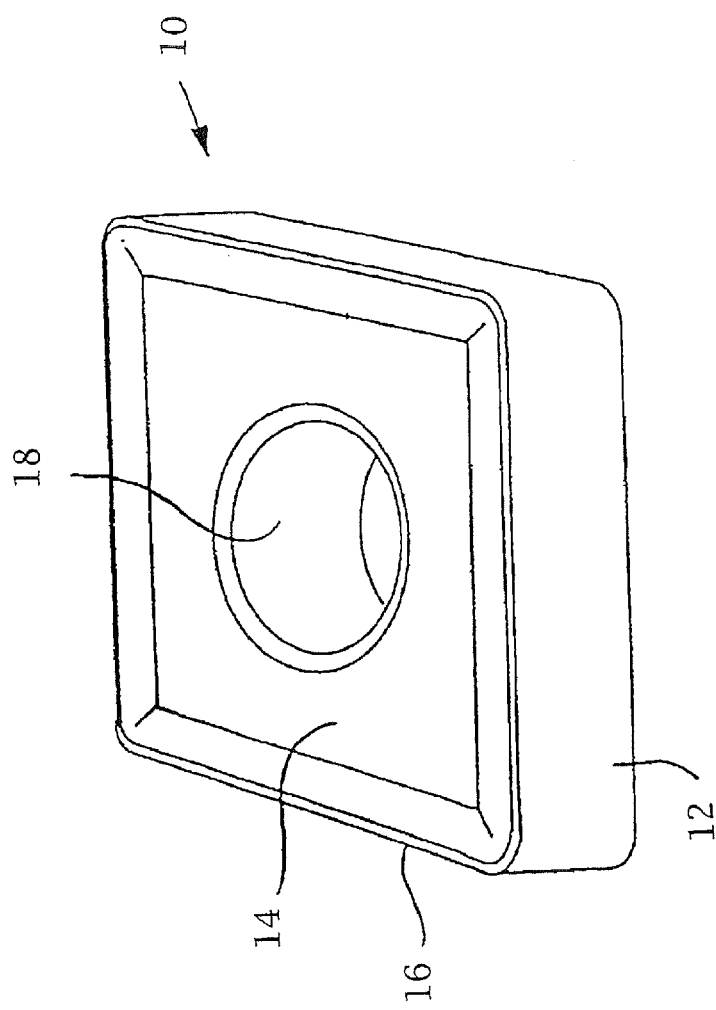
FIG. 1 illustrates a substrate of a coated cutting tool according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

In one aspect, PcBN cutting tools are described having coatings adhered thereto which, in some embodiments, demonstrate desirable wear resistance and increased cutting lifetimes. A coated cutting tool described herein can comprise a PcBN substrate comprising greater than 85 weight percent PcBN and a polished coating adhered to the substrate including one or more layers of $Al_2O_3$ deposited by chemical vapor deposition, wherein the coating has a surface roughness ($R_a$) less than about 600 nm in an area of the cutting tool for contacting a workpiece. In some embodiments, the coating surface roughness ($R_a$) in a workpiece contact area is less than 250 nm or less than 200 nm.

In another aspect, a coated cutting tool described herein comprises a PcBN substrate and a polished coating adhered to the substrate comprising a first $Al_2O_3$ layer deposited directly on the PcBN substrate and a second $Al_2O_3$ layer deposited on a layer of the coating comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table, wherein the coating has a surface roughness ($R_a$) less than about 600 nm in an area of the cutting tool for contacting a workpiece.

Turning now to specific components, a coated cutting tool described herein comprises a PcBN substrate. PcBN substrates can include any amount of PcBN not inconsistent with the objectives of the present invention. For example, PcBN substrates can comprise greater than 85 weight percent PcBN. In some embodiments, a cutting tool substrate described herein comprises PcBN in an amount selected from Table I.

TABLE I

Weight Percent PcBN of Cutting Tool Substrate
Substrate Wt. % PcBN

| ≥60 |
| ≥70 |
| >80 |
| >85 |
| ≥90 |
| 70-95 |
| 86-97 |
| 90-97 |
| 92-95 |

Further, PcBN substrates of cutting tools described herein can also comprise ceramic or metallic binder. Suitable ceramic binders for PcBN substrates can comprise nitrides, carbonitrides, carbides and/or borides of titanium, tungsten, cobalt or aluminum. In some embodiments, for example, a PcBN substrate comprises a binder of AlN, $AlB_2$ or mixtures thereof. Moreover, in some embodiments, a binder comprises solid solutions of any of the foregoing ceramic or metallic binders.

Compositional determination of a PcBN substrate described herein can be conducted by X-ray diffraction (XRD). The cutting tool substrate rake face or flank face can be analyzed depending on cutting tool geometry. For compositional phase analysis of a PcBN substrate described herein, a PANalytical X'pert MRD diffraction system fitted with a Eulerean cradle and microfocus optics for PcBN compacts and tips or a PANalytical X'pert MPD fitted with programmable optics for analysis of a monolithic solid piece of PcBN can be used.

Both x-ray diffraction systems are configured with focusing beam optics and fitted with a copper x-ray tube and operating parameters of 45 KV and 40 MA. For analysis of the monolithic solid piece, the PANalytical MRD is fitted with programmable divergence slit and programmable antiscatter slit. The x-ray beam width is controlled by an appropriate mask size and x-ray beam length is fixed at 2 mm using the programmable optics. The PANalytical MPD is fitted with a linear strip solid state x-ray detector and nickel beta filter.

The PANalytical X'pert MRD system is configured with a microfocus monocapillary optics of either 100μ or 500μ focal spot depending on size of PcBN compact. The PANalytical MRD is fitted with a linear strip solid state x-ray detector and nickel beta filter.

Analysis scan range, counting times, and scan rate are selected to provide optimal data for Rietveld analysis. A background profile is fitted and peak search is performed on the PcBN substrate diffraction data to identify all peak positions and peak intensities. The peak position and intensity data is used to identify the crystal phase composition of the PcBN substrate using any of the commercially available crystal phase databases.

Crystal structure data is input for each of the crystalline phases present in the substrate. Typical Rietveld refinement parameters settings are:
  Sample Geometry: Flat Plate
  Linear Absorption Coefficient: Calculated from average specimen composition
  Weighting Scheme Against $I_{obs}$
  Profile Function Pseudo-Voigt
  Profile Base Width: Chosen per specimen
  Least Squares Type: Newton-Raphson
  Polarization Coefficient: 1.0

The Rietveld refinement typically includes:
  Specimen Displacement: shift of specimen from x-ray alignment
  Background profile selected to best describe the background profile of the diffraction data
  Scale Function: scale function of each phase
  B overall: displacement parameter applied to all atoms in phase
  Cell parameters: a, b, c and alpha, beta, and gamma
  W parameter: describes peak FWHM
  Any additional parameter to achieve an acceptable weighted R-value.

PcBN substrates having compositional parameters described herein can be provided in various constructions. For example, a coated cutting tool can comprise a stand-alone monolithic solid piece PcBN substrate. Alternatively, a PcBN substrate is provided as a compact or insert attached to a support by brazing or other joining technique. Further, a PcBN substrate can be a full top or full top/full bottom cutting insert on a support.

FIG. 1 illustrates a monolithic solid piece PcBN substrate of a coated cutting tool according to one embodiment described herein. The PcBN substrate (10) comprises a flank surface (12) and a rake surface (14), wherein the flank (12) and rake (14) surfaces intersect to provide a cutting edge (16). The substrate also comprises an aperture (18) operable to secure the substrate (10) to a tool holder.

Figure 2:
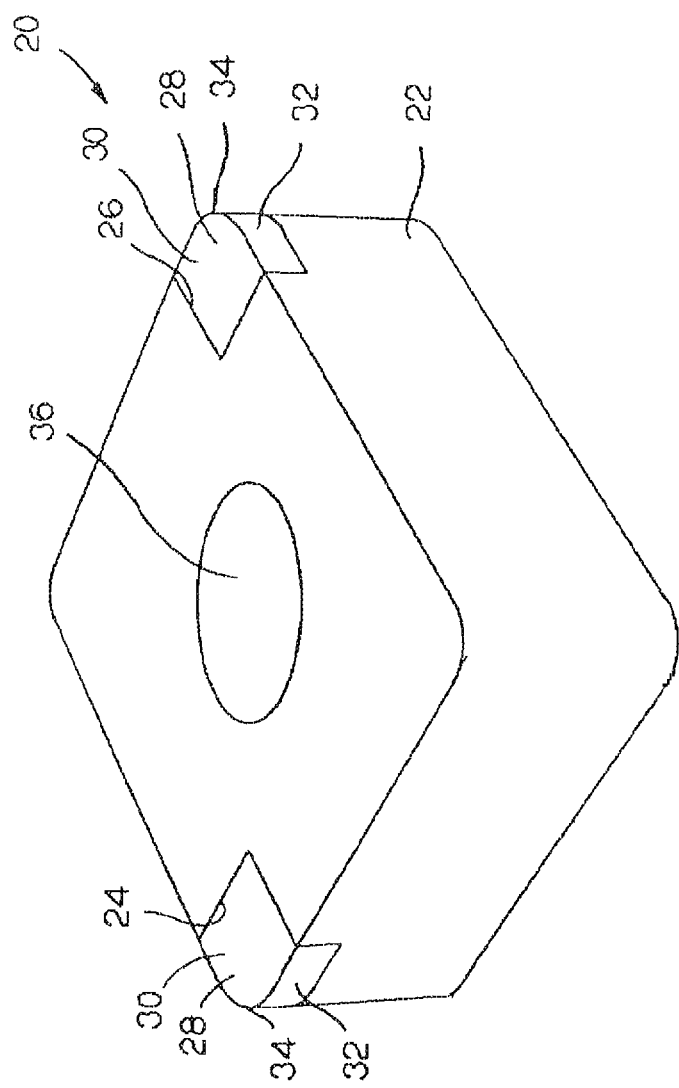
FIG. 2 illustrates a substrate of a coated cutting tool according to one embodiment described herein.

FIG. 2 illustrates a PcBN substrate of a coated cutting tool according to another embodiment wherein the PcBN substrate is provided as a compact or insert joined to a support by brazing or other technique. As illustrated in FIG. 2, the cutting tool (20) comprises a support (22) having notches (24, 26) in opposing corners of the support (22). In some embodiments, the support (22) comprises cemented metal carbide, such as tungsten carbide with a cobalt binder. A PcBN substrate (28) is provided as a compact or insert which affixes by brazing or other technique within each of the notches (24, 26). The PcBN substrate (28) has a rake surface (30) and at least one flank surface (32). A cutting edge (34) is formed at the juncture of the rake surface (30) and at least one flank surface (32). The cutting tool in the embodiment of FIG. 2 further comprises an aperture (36), which can assist the connection of the cutting tool (20) to a tool holder.

Figure 3:
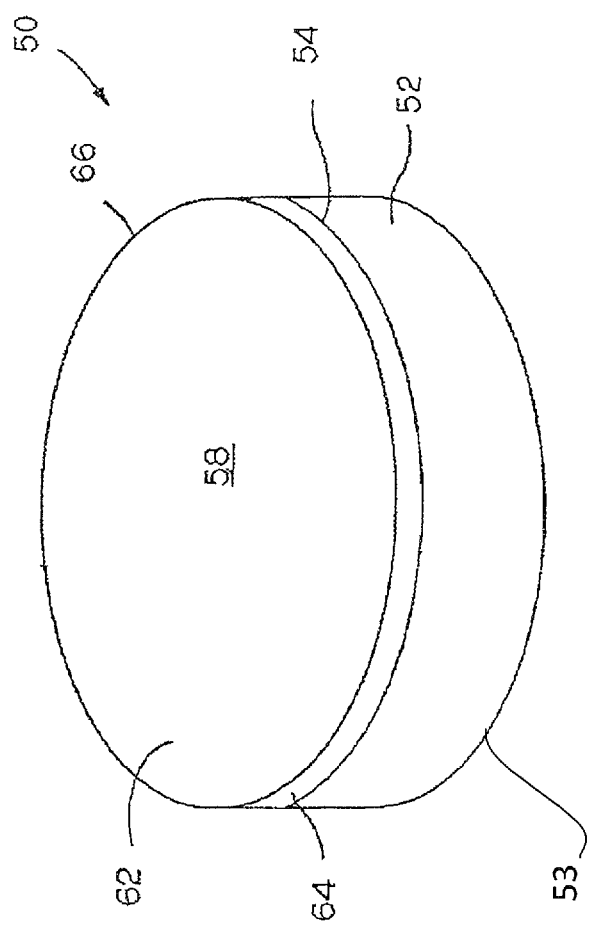
FIG. 3 illustrates a substrate of a coated cutting tool according to one embodiment described herein.

FIG. 3 illustrates a PcBN substrate of a coated cutting tool according to one embodiment wherein the PcBN substrate is provided as an insert on the top surface of a support. As illustrated in FIG. 3, the cutting tool (50) comprises a support (52) having a top surface (54) and a bottom surface (53). In some embodiments, for example, the support (52) comprises cemented metal carbide such as a tungsten carbide with a cobalt binder. The PcBN substrate (58) couples to the top surface (54) of the support (52) by brazing or other joining technique. The PcBN substrate (58) comprises a rake surface

(62) and at least one flank surface (64), wherein a cutting edge (66) is formed at the juncture of the rake surface (62) and at least one flank surface (64).

Figure 4:
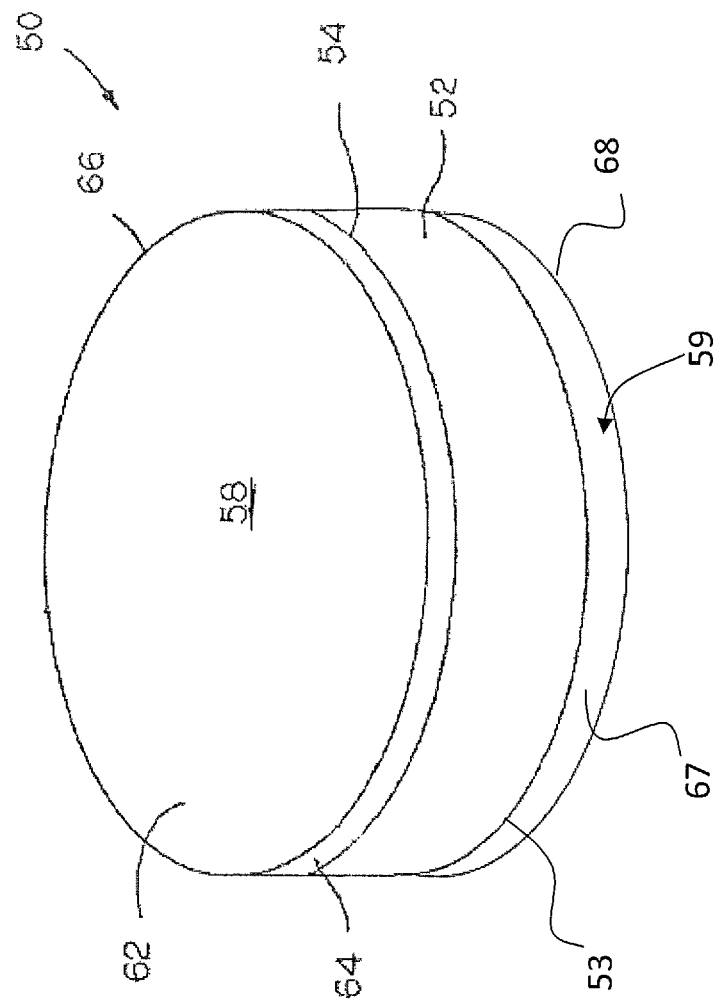
FIG. 4 illustrates a substrate of a coated cutting tool according to one embodiment described herein.

Additionally, in some embodiments, a second PcBN substrate couples to the bottom surface of the support by brazing or other joining technique to provide a configuration wherein the support is sandwiched between top and bottom layers of PcBN. FIG. 4 illustrates an embodiment wherein the support (52) is sandwiched between top (58) and bottom (59) substrates of PcBN. As illustrated in FIG. 4, the bottom PcBN substrate (59) also comprises a rake surface (not shown) and at least one flank surface (67), wherein a cutting edge (68) is formed at the juncture of the rake surface and at least one flank surface (67).

As described herein, a polished coating adhered to the PcBN substrate comprises one or more layers of $Al_2O_3$ deposited by chemical vapor deposition, wherein the coating has a surface roughness ($R_a$) less than about 600 nm in an area of the cutting tool for contacting a workpiece. In some embodiments, an $Al_2O_3$ layer of the polished coating is deposited directly on a surface of the PcBN substrate. Alternatively, an $Al_2O_3$ layer is deposited on an inner layer of the coating comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. For example, an $Al_2O_3$ layer can be deposited on a TiN, TiC or TiCN inner layer of the coating.

Further, an inner layer on which an $Al_2O_3$ layer can be deposited is bonding or modification layer. Bonding or modification layers can be used to increase adhesion between an $Al_2O_3$ layer and underlying layer, such as TiCN, and/or nucleate the desired morphology of the $Al_2O_3$ layer. Suitable bonding/modification layers comprise TiOCN, TiAlOCN or mixtures thereof (TiOCN/TiAlOCN). Bonding/modification layers, in some embodiments, are of sufficient thickness to remain part of the coating architecture after $Al_2O_3$ deposition. In other embodiments, bonding/modification layers are consumed during $Al_2O_3$ deposition and do not have a discernable presence in the final coating architecture.

In some embodiments, a first $Al_2O_3$ layer is deposited directly on the PcBN substrate and a second $Al_2O_3$ layer is deposited on an inner layer of the coating comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. The second $Al_2O_3$ layer, in some embodiments, is deposited over a TiN, TiC or TiCN layer of the coating. A bonding or modification layer can be used during deposition of the second $Al_2O_3$ layer over the TiN, TiC or TiCN layer.

An $Al_2O_3$ layer of a polished coating described herein can include one or more crystalline phases. An $Al_2O_3$ layer, in some embodiments, is $\alpha$-$Al_2O_3$, $\kappa$-$Al_2O_3$ or an $\alpha/\kappa$-$Al_2O_3$ mixture. Additionally, individual $Al_2O_3$ layers of a coating can each demonstrate the same crystalline phase or different crystalline phases. In one embodiment, for example, a first $Al_2O_3$ layer of a coating is $\alpha$-$Al_2O_3$ while a second $Al_2O_3$ layer is $Al_2O_3$. In another embodiment, both first and second $Al_2O_3$ layers of a coating are single phase $\alpha$-$Al_2O_3$.

Further, an $Al_2O_3$ layer of a polished coating described herein can have any desired thickness not inconsistent with the objectives of the present invention. In some embodiments, an $Al_2O_3$ layer of the coating has a thickness selected from Table II.

TABLE II

| $Al_2O_3$ Layer Thickness (μm) $Al_2O_3$ Layer Thickness (μm) |
|---|
| 0.1-15 |
| 0.5-12 |
| 1-10 |
| 5-15 |
| 10-20 |

In some coating embodiments wherein multiple $Al_2O_3$ layers are present, the thickness of an $Al_2O_3$ layer can be selected according to the position of the layer in the coating. An initial $Al_2O_3$ layer deposited directly on the PcBN substrate, for example, can have a thickness less than 1 μm while subsequent $Al_2O_3$ layer(s) deposited over the initial layer are of thickness greater than 1 μm, such as 3-15 μm. Alternatively, an initial $Al_2O_3$ layer deposited directly on the PcBN substrate can have a thickness of at least about 5 μm or at least about 10 μm. In some embodiments, a layer of $Al_2O_3$ layer deposited directly on the PcBN substrate has a thickness ranging from 5 μm to 20 μm.

An $Al_2O_3$ layer can be the outermost layer of the coating. In some embodiments, for example, one or more coating layers can be removed during polishing, thereby partially or fully exposing an underlying $Al_2O_3$ layer. Alternatively, an $Al_2O_3$ layer is not the outermost layer of the coating. In some embodiments, one or more outer layers remain over $Al_2O_3$ layer(s) of the coating after polishing. In such embodiments, a coating outer layer can comprise one or more metallic elements selected from the group consisting of aluminum and metallic elements of Groups IVB, VB and VIB of the Periodic Table and one or more non-metallic elements selected from the group consisting of non-metallic elements of Groups IIIA, VIA, VA and VIA of the Periodic Table. For example, in some embodiments, an outer layer of a polished coating is TiN, TiC or TiCN. Further, an outer layer construction can comprise a combination of TiN and TiCN layers (TiN/TiCN).

Inner and outer layers of coatings described herein can have any thickness not inconsistent with the objectives of the present invention. An inner and/or outer layer of a coating, in some embodiments, can have a thickness ranging from 0.5 μm to 5 μm. Additionally, a polished coating described herein can have a total thickness (summation of all coating layers) less than 12 μm. In some embodiments, a polished coating has a total thickness less than 10 μm or less than 3 μm. A polished coating described herein can have a total thickness ranging from 1-12 μm or from 2-10 μm.

Further, a polished coating adhered to a PcBN substrate can have any arrangement or architecture of $Al_2O_3$ layer(s), inner layer(s) and/or outer layer(s) described herein. In some embodiments, a coated cutting tool described herein has an architecture selected from Table III. Coating structures provided in Table III begin with the innermost layer adjacent to the substrate and continue to the outermost layer.

TABLE III

Coated Cutting Tool Architectures

| Substrate | CVD Coating Structure |
|---|---|
| PcBN | $Al_2O_3$ |
| PcBN | $Al_2O_3$—TiN—TiCN—$Al_2O_3$—TiN |
| PcBN | $Al_2O_3$—TiN—TiCN—$Al_2O_3$—TiN/TiCN |
| PcBN | $Al_2O_3$—TiN—TiCN—$Al_2O_3$ |
| PcBN | $Al_2O_3$—TiN |
| PcBN | $Al_2O_3$—TiN/TiCN |

TABLE III-continued

Coated Cutting Tool Architectures

| Substrate | CVD Coating Structure |
|---|---|
| PcBN | $Al_2O_3$—TiCN—TiN |
| PcBN | $Al_2O_3$—TiCN—TiN/TiCN |
| PcBN | $Al_2O_3$—TiCN |

A polished CVD coating having a structure described herein displays a surface roughness ($R_a$) less than 600 nm in an area of the PcBN cutting tool for contacting a workpiece. A workpiece contact area of a cutting tool can include one or more cutting edges of the tool. In some embodiments, for example, a workpiece contact area is a honed region of the cutting tool. In embodiments, a polished coating described herein has a surface roughness ($R_a$) in a workpiece contact area selected from Table IV.

TABLE IV

Polished Coating Surface Roughness ($R_a$)
Polished Coating Surface Roughness ($R_a$) - nm

≤500
≤250
<200
10-250
50-175
25-150

Coating surface roughness can be determined by optical profilometry using WYKO® NT-Series Optical Profilers commercially available from Veeco Instruments, Inc. of Plainview, N.Y.

As discussed further herein, coatings can be polished to obtain the desired surface roughness under sufficiently mild conditions so as not to alter the stress condition of the coating in the polished area. In some embodiments, for example, polishing does not reduce levels of residual tensile stress and/or increase levels of residual compressive stress in the coating. In some embodiments wherein the outer layer is removed by polishing, the polishing does not alter or substantially alter the stress condition of the remaining layer(s) of the coating. Further, coatings described herein can demonstrate surface morphologies and structures consistent with being polished, such as striations and/or directionally dependent polishing lines.

II. Methods of Making Coated Cutting Tools

In another aspect, methods of making coated cutting tools are described herein. A method of making a coated cutting tool, in some embodiments, comprises providing a PcBN substrate and depositing over the substrate by chemical vapor deposition a coating comprising one or more layers of $Al_2O_3$. The deposited coating is polished to a surface roughness ($R_a$) less than 600 nm in an area of the cutting tool for contacting a workpiece.

Turning now to specific steps, a method described herein comprises providing a substrate comprising PcBN. Any PcBN substrate recited in Section I hereinabove can be used. A substrate, for example, can have a PcBN content selected from Table I herein. For example, in one embodiment, the PcBN substrate can comprise greater than 85 weight percent PcBN. In some embodiments, a rough shaped PcBN substrate is provided, and the top/bottom/periphery/T-land of the substrate are ground with a diamond grinding wheel. Hone is added with a Gerber process employing a flat brush with loose diamond media of the appropriate particle size to achieve the target hone size. Further, the PcBN substrate can be subjected to a precoat treatment of wet blasting with ceramic particles such as alumina particles. The wet blasting treatment cleans and prepares PcBN substrate surfaces for CVD deposition of a coating described herein. The blasted PcBN substrate may be washed in an ultrasonic water bath to remove any foreign particles and films from the wet blasting treatment.

A coating comprising one or more layers of $Al_2O_3$ is deposited by chemical vapor deposition on surfaces of the PcBN substrate. The coating can have any construction, compositional parameters and/or properties described in Section I herein. In some embodiments, for example, a coating deposited by CVD according to a method described herein has a structure selected from Table III above. Further, individual layers of coatings described herein can be deposited from reactant gas mixtures having components provided in Table V.

TABLE V

Coating Layer Reactant Gas Mixtures

| Coating Layer | Reactant Gas Mixture |
|---|---|
| $Al_2O_3$ | $H_2$, $AlCl_3$, $CO_2$, HCl, $H_2S$ |
| TiN | $H_2$, $N_2$, $TiCl_4$ |
| TiCN | $H_2$, $N_2$, $TiCl_4$, $CH_3CN$ |
| TiOCN* | $H_2$, $N_2$, $TiCl_4$, $CH_4$, CO |
| TiAlOCN* | $H_2$, $N_2$, $TiCl_4$, $CH_4$, CO, $AlCl_3$ |

*Bonding/Modification Layer

As known to one of skill in the art, structural parameters specific to individual coating layers listed in Table V, such as desired thickness, grain size and/or crystalline phase, can be achieved by varying CVD process parameters of deposition time, temperature and pressure as well as compositional percentages of reactant gas species in the mixture.

Following deposition, the CVD coating is polished to a surface roughness ($R_a$) less than about 600 nm in an area of the cutting tool for contacting a workpiece. In some embodiments, the CVD coating is polished in a workpiece contact area to a surface roughness ($R_a$) having a value selected from Table IV hereinabove.

A workpiece contact area of a cutting tool can include one or more cutting edges of the tool. In some embodiments, for example, a workpiece contact area is a honed region of the cutting tool. Polishing can be administered with paste of appropriate diamond or ceramic grit size. Grit size of the paste, in some embodiments, ranges from 1 μm to 10 μm. In one embodiment, a 5-10 μm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the PcBN cutting tool.

The coating is polished for a time period sufficient to achieve the desired surface roughness ($R_a$) in a workpiece contact area of the cutting tool. As described herein, polishing conditions can be selected so as not to alter or substantially alter the stress condition of the coating in the polished area. In some embodiments, for example, polishing does not reduce levels of residual tensile stress and/or increase levels of residual compressive stress in the coating. As known to one of skill in the art, pre- and post-polishing stress conditions of layer(s) of the coating can be determined by XRD using the $Sin^2\psi$ method with reference to reflection from the appropriate crystallographic plane (hkl) of the layer being analyzed.

Polishing, in some embodiments, does not remove one or more outer layers of the coating. With reference to Table III hereinabove, polishing does not remove one or more outer layers of TiN, TiCN, TiN/TiCN and/or $Al_2O_3$. Alternatively, in some embodiments, polishing does remove or partially remove one or more outer layers of the coating. Outer layer(s) of TiN and/or TiCN can be partially or fully removed, thereby exposing an underlying $Al_2O_3$ layer. In some embodiments wherein one or more outer layers are removed by polishing, the polishing does not alter or substantially alter the stress condition of the remaining layer(s) of the coating.

In being polished, a CVD coating described herein is not subjected to post coat blasting or shot techniques, such as wet or dry blasting with ceramic or other particle types. Further, the coated cutting tool can be cleaned in an ultrasonic water bath to remove any residual paste or grit from the polishing process.

III. Methods of Machining Unaged Cast Iron

In a further aspect, methods of machining unaged cast iron workpieces are described herein. A method of machining an unaged cast iron workpiece comprises providing a coated cutting tool comprising a substrate of PcBN and a polished coating adhered thereto including one or more layers of $Al_2O_3$ deposited by chemical vapor deposition, wherein the polished coating has a surface roughness ($R_a$) less than about 600 nm in an area for contacting the cast iron workpiece. The unaged cast iron workpiece is machined with the coated PcBN cutting tool, wherein the coated cutting tool demonstrates an increase in cutting lifetime of at least 30% in comparison to a substantially identical CVD coated PcBN cutting tool wherein the coating is not polished in the workpiece contact area. Unaged cast iron workpieces, as used herein, refer to cast iron workpieces less than 3 days old from pour.

The coated cutting tool comprising a PcBN substrate and a polished coating adhered thereto can have any construction, compositional parameters and/or properties described in Section I hereinabove. In some embodiments, for example, the coated PcBN cutting tool comprises a substrate having a PcBN content selected from Table I herein and coating architecture selected from Table III herein. Further, the coating can have a surface roughness ($R_a$) in a workpiece contact area selected from Table IV herein.

The coated cutting tool comprising a PcBN substrate and a polished coating adhered thereto, in some embodiments, demonstrates an increase in cutting lifetime for unaged cast iron according to Table VI in comparison to a substantially identical coated cutting tool wherein the coating is not polished in the workpiece contact area.

TABLE VI

Increase in Cutting Lifetime when Machining Unaged Cast Iron
Percent Increase in Cutting Lifetime vs. PcBN Cutting
Tool Having Unpolished CVD Coating

| |
|---|
| ≥50 |
| ≥70 |
| ≥90 |
| 50-99 |
| 70-99 |
| 90-99 |

Additionally, a coated cutting tool comprising a PcBN substrate and a polished coating adhered thereto, in some embodiments, demonstrates an increase in cutting lifetime for unaged cast iron of at least 10% in comparison to a substantially identical coated PcBN cutting tool wherein the coating is particle blasted in the workpiece contact area.

As provided in the following Examples, coated PcBN cutting tools described herein having a polished CVD coating and comparative cutting tools of unpolished CVD coatings are subjected to identical cutting conditions for lifetime evaluation. Further, the unaged cast iron workpieces machined with coated PcBN cutting tools described herein are grey (gray) cast iron.

These and other embodiments are further illustrated by the following non-limiting examples.

Example 1

Coated Cutting Tool Body

Coated PcBN cutting tool (A) having a constructions described herein was produced by placing a PcBN cutting insert substrate [ANSI geometry CNM433S0820] into an axial flow hot-wall CVD reactor. Prior to placing in the CVD reactor, the PcBN substrate was prepared and cleaned as described in Section II hereinabove. The substrate comprised 90 weight percent PcBN with the balance AlN and $AlB_2$ binder. A coating having an architecture described herein was deposited on PcBN substrate (A) according to the CVD process parameters provided in Table VII.

TABLE VII

CVD Deposition of Coating

| Process Step | Temp. °C. | Pressure mbar | Time min | Gases Utilized |
|---|---|---|---|---|
| (1) α-$Al_2O_3$ | 950-1000 | 60-200 | 60-120 | $H_2$, $AlCl_3$, $CO_2$, HCl, $H_2S$ |
| (2) TiN | 850-920 | 60-200 | 20-40 | $H_2$, $N_2$, $TiCl_4$ |

The resulting multilayered CVD coating demonstrated the properties provided in Table VIII.

TABLE VIII

Properties of CVD Coating

| Coating Layer | Thickness (μm) |
|---|---|
| α-$Al_2O_3$ | 1-2 |
| TiN | 0.8-1.2 |

The CVD coating was subsequently polished in the hone area of PcBN cutting tool (A) to a surface roughness ($R_a$) less than 250 nm using 5-10 μm diamond grit paste applied via a flat brush. Polishing of the CVD coating removed the outer TiN layer at the cutting edge. Coated PcBN cutting tool (A) was then washed in an ultrasonic water bath to remove any residual grit or paste.

Example 2

Coated Cutting Tool Body

Coated PcBN cutting tool (B) having a construction described herein was produced by placing a PcBN cutting insert substrate [ANSI geometry CNMA433S0820] into an axial flow hot-wall CVD reactor. Prior to placing the in the CVD reactor, the PcBN substrate was prepared and cleaned as described in Section II hereinabove. The substrate comprised 90 weight percent PcBN with the balance AlN and $AlB_2$ binder. A coating having an architecture described herein was deposited on the PcBN substrate according to the CVD process parameters provided in Table IX.

TABLE IX

CVD Deposition of Coating

| Process Step | Temp. °C. | Pressure mbar | Time min. | Gases Utilized |
|---|---|---|---|---|
| (1) α-Al$_2$O$_3$ | 950-1000 | 60-200 | 45-90 | H$_2$, AlCl$_3$, CO$_2$, HCl, H$_2$S |
| (2) TiN | 800-920 | 60-200 | 30-60 | H$_2$, N$_2$, TiCl$_4$ |
| (3) MT*-TiCN | 800-940 | 60-200 | 45-90 | H$_2$, N$_2$, TiCl$_4$, CH$_3$CN |
| (4) TiCN | 900-980 | 60-200 | 15-30 | H$_2$, N$_2$, TiCl$_4$, CH$_3$CN |
| (5) TiOCN/ TiAlOCN** | 900-980 | 60-200 | 10-20 | H$_2$, N$_2$, TiCl$_4$, CH$_4$, CO, AlCl$_3$ |
| (5) α-Al$_2$O$_3$ | 950-1000 | 60-200 | 450-520 | H$_2$, AlCl$_3$, CO$_2$, HCl, H$_2$S |
| (6) TiN | 800-920 | 60-200 | 20-40 | H$_2$, N$_2$, TiCl$_4$ |

*Medium Temperature
**Modification Layer

The resulting multilayered CVD coating demonstrated the properties provided in Table X.

TABLE X

Properties of CVD Coating

| Coating Layer | Thickness (μm) |
|---|---|
| (1) α-Al$_2$O$_3$ | 0.3-1.0 |
| (2) TiN | 0.2-0.5 |
| (3) MT-TiCN | 1.2-2 |
| (4) TiCN | 0.1-0.3 |
| (5) α-Al$_2$O$_3$ | 3.8-5 |
| (6) TiN | 1.5-3 |

The CVD coating was subsequently polished in the hone area of PcBN cutting tool (B) to a surface roughness (R$_a$) less than 250 nm using 5-10 μm diamond grit paste applied via a flat brush. Polishing of the CVD coating removed the outer TiN layer at the cutting edge. Coated PcBN cutting tool (B) was then washed in an ultrasonic water bath to remove any residual grit or paste.

Example 3

Coated Cutting Tool Bodies

Coated PcBN cutting tools (C-E) having constructions described herein were produced as follows. PcBN substrates of cutting tools C-E were provided according to Table XI,

TABLE XI

PcBN Substrates

| Cutting Tool | PcBN Substrate Composition | ANSI Geometry |
|---|---|---|
| C | 90% PcBN; Bal. AlN, AlB$_2$ binder | CNM433S0820 |
| D | 92% PcBN; Bal. AlN, AlB$_2$ binder | CNM433S0820 |
| E | 70% PcBN; Bal. TiCN binder | CNM433S0820 |

Prior to placing the in an axial flow hot-wall CVD reactor, PcBN substrates (C-E) were prepared and cleaned as described in Section II hereinabove, A coating having an architecture described herein was deposited on each of PcBN substrates (C-E) according to the CVD process parameters provided in Table XII.

TABLE XII

CVD Deposition of Coating

| Process Step | Temp. °C. | Pressure mbar | Time min. | Gases Utilized |
|---|---|---|---|---|
| (1) α-Al$_2$O$_3$ | 800-900 | 60-200 | 400-520 | H$_2$, AlCl$_3$, CO$_2$, HCl, H$_2$S |
| (2) TiN | 800-920 | 60-200 | 20-40 | H$_2$, N$_2$, TiCl$_4$, HCl |

The resulting CVD multilayered coatings demonstrated the properties provided in Table XIII.

TABLE XIII

Properties of CVD Coating

| Coating Layer | Thickness (μm) |
|---|---|
| α-Al$_2$O$_3$ | 10-11 |
| TiN | 0.5-1 |

The CVD coating was subsequently polished in the hone area of each PcBN cutting tool (C-E) to a surface roughness (R$_a$) less than 250 nm using 5-10 μm diamond grit paste applied via a flat brush. Polishing of the CVD coating removed the outer TiN layer at the cutting edge, until the outer TiN layer was removed. The coated PcBN cutting tool was then washed in an ultrasonic water bath to remove any residual grit or paste.

Example 4

Coated Cutting Tool Bodies

Coated PcBN cutting tools (F and G) were each provided a polished CVD coating as set forth in Example 2 above. PcBN substrates of coated cutting tools (F and G) were provided according to Table XIV.

TABLE XIV

PcBN Substrates

| Cutting Tool | PcBN Substrate Composition | ANSI Geometry |
|---|---|---|
| F | 90% PcBN; Bal. AlN, AlB$_2$ binder | CNM433S0820 |
| G | 92% PcBN; Bal. AlN, AlB$_2$ binder | CNM433S0820 |

Example 5

Coated Cutting Tool Bodies

Coated PcBN cutting tools (H and I) having constructions described herein were produced as follows. PcBN substrates of cutting tools (H and I) were provided according to Table XV.

TABLE XV

PcBN Substrates

| Cutting Tool | PcBN Substrate Composition | ANSI Geometry |
|---|---|---|
| H | 90% PcBN; Bal. AlN, AlB$_2$ binder | CNM433S0820 |
| I | 92% PcBN; Bal. AlN, AlB$_2$ binder | CNM433S0820 |

Prior to placing the in an axial flow hot-wall CVD reactor, PcBN substrates (H and I) were prepared and cleaned as described in Section II hereinabove. A coating having an architecture described herein was deposited on each of PcBN substrates (H and I) according to the CVD process parameters provided in Table XVI.

TABLE XVI

CVD Deposition of Coating

| Process Step | Temp. °C. | Pressure mbar | Time min. | Gases Utilized |
|---|---|---|---|---|
| (1) α-Al$_2$O$_3$ | 800-900 | 60-200 | 400-520 | H$_2$, AlCl$_3$, CO$_2$, HCl, H$_2$S |
| (2) TiCN | 900-980 | 60-200 | 20-50 | H$_2$, N$_2$, TiCl$_4$, CH$_3$CN |
| (3) TiN | 800-920 | 60-200 | 20-40 | H$_2$, N$_2$, TiCl$_4$ |

The resulting multilayered CVD coating demonstrated the properties provided in Table XVII.

TABLE XVII

Properties of CVD Coating

| Coating Layer | Thickness (μm) |
|---|---|
| α-Al$_2$O$_3$ | 6-7 |
| TiCN | 2-3 |
| TiN | 0.3-1 |

The CVD coating was subsequently polished in the hone area of each PcBN cutting tool (H and I) to a surface roughness ($R_a$) less than 250 nm using 5-10 μm diamond grit paste applied via a flat brush. Polishing of the CVD coating removed the outer TiN layer at the cutting edge. Coated PcBN cutting tools (H and I) were then washed in an ultrasonic water bath to remove any residual grit or paste.

Example 6

Cutting Tool Lifetime

CVD coated PcBN cutting tool (A) of Example 1 was subjected to cutting lifetime testing of aged grey cast iron in comparison to Comparative CVD coated PcBN cutting tools (J and K). As provided in Table XVIII, Comparative coated PcBN cutting tools (J and K) share the same substrate and CVD coating architecture as cutting tool (A). However, the CVD coatings of Comparative cutting tools (J and K) were not polished to a surface roughness ($R_a$) described herein in a workpiece contact area of the cutting tool. Further, Comparative cutting tool (J) was wet blasted with Al$_2$O$_3$ particle slurry to a surface roughness less than about 250 nm.

TABLE XVIII

Comparative CVD Coated PcBN Cutting Tools

| Cutting Tool | PcBN Substrate Composition | ANSI Geometry | CVD Coating | CVD Coating Treatment |
|---|---|---|---|---|
| J | 90% PcBN; Bal. AlN, AlB$_2$ binder | CNM433S0820 | Same as Example 1 | None |
| K | 90% PcBN; Bal. AlN, AlB$_2$ binder | CNM433S0820 | Same as Example 1 | Post-coat blast with Al$_2$O$_3$ grit slurry to $R_a$ <250 nm |

For lifetime testing, two cutting edges were tested for each CVD coated PcBN cutting insert (A, J and K) as follows:

Workpiece—Aged Class 30 Gray CI Tubes with (w/OD scale)

Feed Rate—0.016 ipr

Depth of Cut—0.060 inch

Lead Angle: −5°

Coolant—DRY

The mean lifetime in minutes of each CVD coated PcBN cutting insert (A, J and K) is provided in Table XIX. EOL was registered by one or more failure modes of:

Uniform Wear (UW)=0.012 inches

Max Wear (MW)=0.012 inches

Nose Wear (NW)=0.012 inches

Depth of Cut Notch Wear (DOCN)=0.012 inches

Trailing Edge Wear (TW)=0.012 inches

TABLE XIX

Mean Cutting Lifetime (Aged Grey Cast Iron)

| CVD Coated PcBN Cutting Tool | Mean Cutting Lifetime | Failure Mode |
|---|---|---|
| A | 29.1 | NW |
| J* | 10.4 | MW |
| K* | 25.9 | NW |

*Comparative CVD Coated PcBN Cutting Tools

As provided in Table XIX, PcBN cutting tool (A) having the polished CVD coating demonstrated a 180% increase in lifetime relative to Comparative cutting tool (J) and a 12% increase in lifetime over Comparative cutting tool (K) having a particle blasted coating.

Example 7

Cutting Tool Lifetime

CVD coated PcBN cutting tools (B-E) of Examples 2 and 3 were subjected to cutting lifetime testing of unaged grey cast iron in comparison to Comparative CVD coated PcBN cutting tool (L). As provided in Table XX, the architecture of Comparative cutting tool (L) is the same as coated PcBN cutting tool (B). However, the CVD coating of Comparative cutting tool (L) was not polished to a surface roughness ($R_a$) described herein in a workpiece contact area of the cutting tool.

TABLE XX

Comparative CVD Coated PcBN Cutting Tools

| Cutting Tool | PcBN Substrate Composition | ANSI Geometry | CVD Coating | CVD Coating Treatment |
|---|---|---|---|---|
| L | 90% PcBN; Bal. AlN, AlB$_2$ binder | CNMA433S0820 | Same as Example 2 | None |

For the lifetime testing, one repetition was performed for each CVD coated PcBN insert (B-E and L) as follows:
Workpiece—Unaged Class 30 Gray CI Tubes with (w/OD scale)
Feed Rate—0.016 ipr
Depth of Cut—0.060 inch
Lead Angle: −5°
Coolant—DRY The lifetime in minutes of each CVD coated PcBN cutting insert (B-E and L) is provided in Table XXI. EOL was registered by one or more failure modes of:
Uniform Wear (UW)=0.012 inches
Max Wear (MW)=0.012 inches
Nose Wear (NW)=0.012 inches
Depth of Cut Notch Wear (DOCN)=0.012 inches
Trailing Edge Wear (TW)=0.012 inches

TABLE XXI

Mean Cutting Lifetime (Unaged Grey Cast Iron)

| CVD Coated PcBN Cutting Tool | Cutting Lifetime | Failure Mode |
|---|---|---|
| B | 27.0 | NW |
| C | 24.2 | NW |
| D | 26.7 | NW |
| E | 19.1 | NW |
| L* | 13.6 | NW |

*Comparative CVD Coated PcBN Cutting Tools

As provided in Table XXI, PcBN cutting tools comprising polished CVD coatings (B-E) demonstrated enhanced cutting lifetimes relative to Comparative cutting tool (L). For direct comparison, PcBN cutting tool (B) having a polished CVD coating described herein displayed a 99% increase in cutting lifetime relative to Comparative cutting tool (L).

Example 8

Cutting Tool Lifetime

CVD coated PcBN cutting tools (D and F-I) of Examples 3-5 were subjected to cutting lifetime testing of unaged grey cast iron as follows:
Workpiece—Unaged Class 30 GCI As Cast—Unaged
Feed Rate—0.016 ipr
Depth of Cut—0.060 inch
Lead Angle: −5°
Coolant—DRY The mean lifetime in minutes over two cutting edges of each CVD coated PcBN insert (D and F-I) is provided in Table XXII. EOL was registered by one or more failure modes of:
Uniform Wear (UW)=0.012 inches
Max Wear (MW)=0.012 inches
Nose Wear (NW)=0.012 inches
Depth of Cut Notch Wear (DOCN)=0.012 inches
Trailing Edge Wear (TW)=0.012 inches

TABLE XXII

Mean Cutting Lifetime (Unaged Grey Cast Iron)

| CVD Coated PcBN Cutting Tool | Cutting Lifetime | Failure Mode |
|---|---|---|
| D | 15.7 | NW |
| F | 17.2 | NW |
| G | 13.5 | NW |
| H | 11.9 | NW |
| I | 15.3 | NW |

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A coated cutting tool comprising:
   a polycrystalline cubic boron nitride (PcBN) substrate comprising greater than 85 weight percent PcBN; and
   a polished coating adhered to the substrate comprising first and second layers of Al$_2$O$_3$ deposited by chemical vapor deposition, wherein the first Al$_2$O$_3$ layer of the coating is deposited directly on the PcBN substrate and the second Al$_2$O$_3$ layer is deposited on TiN, TiC or TiCN layer and wherein the coating has a surface roughness ($R_a$) less than about 600 nm in an area of the cutting tool for contacting a workpiece.

2. The coated cutting tool of claim 1, wherein the surface roughness ($R_a$) is less than about 250 nm.

3. The coated cutting tool of claim 1, wherein the surface roughness ($R_a$) ranges from about 25 nm to less than 200 nm.

4. The coated cutting tool of claim 1, wherein the first Al$_2$O$_3$ layer has thickness less than about 1 μm and the second Al$_2$O$_3$ layer has thickness greater than about 3 μm.

5. The coated cutting tool of claim 1 further comprising an outer layer deposited over the one or more Al$_2$O$_3$ layers, the outer layer comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table.

6. The coated cutting tool of claim 5, wherein the outer layer is TiN, TiCN or a combination of TiN and TiCN layers.

7. The coated cutting tool of claim 1, wherein the one or more Al$_2$O$_3$ layers are α-Al$_2$O$_3$.

8. The coated cutting tool of claim 1, wherein the coating is polished in an area of the cutting tool for contacting a workpiece.

9. The coated cutting tool of claim 1, wherein the coating comprises the structure of Al$_2$O$_3$—TiN-medium temperature TiCN—TiCN—Al$_2$O$_3$—TiN.

10. A coated cutting tool comprising:
    a polycrystalline cubic boron nitride substrate; and
    a polished coating adhered to the substrate comprising a first Al$_2$O$_3$ layer deposited directly on the PcBN substrate and a second Al$_2$O$_3$ layer deposited on a layer of TiN, TiC or TiCN, wherein the coating has a surface roughness ($R_a$) less than about 600 nm in an area of the cutting tool for contacting a workpiece.

11. The coated cutting tool of claim 10, wherein the surface roughness ($R_a$) ranges from greater than 200 nm to about 600 nm.

12. The coated cutting tool of claim 10, wherein the surface roughness ($R_a$) is less than about 250 nm.

13. The coated cutting tool of claim 10, wherein the first $Al_2O_3$ layer has thickness less than about 1 μm and the second $Al_2O_3$ layer has thickness greater than about 3 μm.

14. The coated cutting tool of claim 10, wherein the substrate comprises at least 90 weight percent PcBN.

15. The coated cutting tool of claim 10, wherein the first $Al_2O_3$ layer is α-$Al_2O_3$.

16. The coated cutting tool of claim 10, wherein the coating comprises the structure of $Al_2O_3$—TiN-medium temperature TiCN—TiCN—$Al_2O_3$—TiN.

17. The coated cutting tool of claim 10, wherein the polycrystalline cubic boron nitride substrate is brazed to a support.

18. A coated cutting tool comprising:
a polycrystalline cubic boron nitride (PcBN) substrate comprising greater than 85 weight percent PcBN; and
a polished coating adhered to the substrate comprising first and second layers of $Al_2O_3$ deposited by chemical vapor deposition, wherein the first $Al_2O_3$ layer of the coating having thickness less than about 1 μm is deposited directly on the PcBN substrate and the second $Al_2O_3$ layer having thickness greater than about 3 μm is deposited on a layer of the coating comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table, wherein the coating has a surface roughness ($R_a$) less than about 600 nm in an area of the cutting tool for contacting a workpiece.

19. The coated cutting tool of claim 18, wherein the surface roughness ($R_a$) ranges from about 25 nm to about 150 nm.

20. The coated cutting tool of claim 18 further comprising an outer layer deposited over the one or more $Al_2O_3$ layers, the outer layer comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table.

21. The coated cutting tool of claim 18, wherein the second $Al_2O_3$ layer is deposited on a layer to TiN, TiC, TiCN, TiOCN, TiAlOCN or a mixture to TiOCN and TiAlOCN.

22. The coated cutting tool of claim 18, wherein the substrate comprises at least 90 weight percent PcBN.

23. The coated cutting tool of claim 18, wherein the first $Al_2O_3$ layer is α-$Al_2O_3$.

24. The coated cutting tool of claim 18, wherein the coating comprises the structure of $Al_2O_3$—TiN-medium temperature TiCN—TiCN—$Al_2O_3$—TiN.

25. A coated cutting tool comprising:
a polycrystalline cubic boron nitride substrate; and
a polished coating adhered to the substrate comprising a first $Al_2O_3$ layer having thickness less than about 1 μm deposited directly on the PcBN substrate and a second $Al_2O_3$ layer having thickness greater than about 3 μm deposited on a layer of the coating comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table, wherein the coating has a surface roughness ($R_a$) less than about 600 nm in an area of the cutting tool for contacting a workpiece.

26. The coated cutting tool of claim 25, wherein the surface roughness ($R_a$) ranges from about 25 nm to about 150 nm.

27. The coated cutting tool of claim 25 further comprising an outer layer deposited over the one or more $Al_2O_3$ layers, the outer layer comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table.

28. The coated cutting tool of claim 25, wherein the second $Al_2O_3$ layer is deposited on a layer to TiN, TiC, TiCN, TiOCN, TiAlOCN or a mixture to TiOCN and TiAlOCN.

29. The coated cutting tool of claim 25, wherein the substrate comprises at least 90 weight percent PcBN.

30. The coated cutting tool of claim 25, wherein the first $Al_2O_3$ layer is α-$Al_2O_3$.

31. The coated cutting tool of claim 25, wherein the coating comprises the structure of $Al_2O_3$—TiN-medium temperature TiCN—TiCN—$Al_2O_3$—TiN.

32. The coated cutting tool of claim 25, wherein the coating is polished in the area of the cutting tool for contacting a workpiece.

33. The coated cutting tool of claim 25, wherein the polycrystalline cubic boron nitride substrate is brazed to a support.

* * * * *